(12) United States Patent
Storniolo et al.

(10) Patent No.: US 7,400,214 B2
(45) Date of Patent: Jul. 15, 2008

(54) LOW LOSS, HIGH POWER AIR DIELECTRIC STRIPLINE EDGE COUPLING STRUCTURE

(75) Inventors: Joseph Storniolo, Aliso Viejo, CA (US); Jeremy Monroe, Aliso Viejo, CA (US); Melanie Daniels, Folsom, CA (US); William Veitschegger, Folsom, CA (US); Michael Hrybenko, Syosset, NY (US); Frank Kimmey, Sacramento, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 30 days.

(21) Appl. No.: 11/214,230

(22) Filed: Aug. 29, 2005

(65) Prior Publication Data

US 2006/0044075 A1 Mar. 2, 2006

Related U.S. Application Data

(60) Provisional application No. 60/605,478, filed on Aug. 30, 2004.

(51) Int. Cl.
*H01P 5/18* (2006.01)

(52) U.S. Cl. .................................... 333/116; 333/117

(58) Field of Classification Search ................. 333/116, 333/117

See application file for complete search history.

(56) References Cited

U.S. PATENT DOCUMENTS

| 4,394,630 | A | | 7/1983 | Kenyon et al. | ............... 333/116 |
| 4,459,568 | A | * | 7/1984 | Landt | ............... 333/116 |
| 5,712,607 | A | | 1/1998 | Dittmer et al. | ............... 333/238 |
| 6,972,639 | B2 | * | 12/2005 | Podell | ............... 333/112 |
| 2004/0041657 | A1 | * | 3/2004 | Paakkonen et al. | ............... 333/116 |

* cited by examiner

*Primary Examiner*—Benny Lee
(74) *Attorney, Agent, or Firm*—David L. Henty; Myers, Dawes, Andras & Sherman LLP

(57) ABSTRACT

A high power, low loss RF strip transmission line coupling structure is provided. It includes a multi-layer printed circuit board (PCB), a top cover and a bottom cover. The top and bottom covers provide the ground reference for the strip transmission line coupling structure. The PCB is fastened to the top and bottom covers and is used for: creating the center conductor of an air dielectric strip transmission line and edge coupler; providing a means to transition from microstrip to air dielectric strip transmission line; supporting the air dielectric strip transmission line; routing of other signals; and passing ground to the top and bottom covers. To create an air dielectric strip transmission line, the PCB material is adequately removed to effectively form a rectangular bar of dielectric and metal layers. This rectangular bar is plated along the edges where the PCB material was removed to ensure that the top and bottom PCB metal layers are at the same potential.

16 Claims, 4 Drawing Sheets

LOW LOSS, HIGH POWER AIR DIELECTRIC STRIPLINE EDGE COUPLING STRUCTURE

RELATED APPLICATION INFORMATION

The present application claims priority under 35 USC 119(e) of provisional application Ser. No. 60/605,478 filed Aug. 30, 2004, the disclosure of which is incorporated herein by reference in its entirety.

BACKGROUND OF THE INVENTION

1. Field of the Invention

The present invention relates to high power and/or low loss RF applications. More particularly, the present invention relates to high power and/or low loss RF applications where low loss, high performance coupling structures and a multi-layer PCB are required

2. Description of the Prior Art and Related Background Information

Directional coupling structures are well known in the art of RF design. These directional coupling structures are often used for sampling, combining or injecting signals. Directional couplers may be distinguished from other RF signal sampling, combining or injecting structures by their ability to sample (for example) power flowing in a particular direction while ignoring power flowing an opposite direction. A common metric for the directional coupler then is directivity—the ability of the coupling structure to distinguish between forward and reverse power flow. For a loose directional coupler to have high directivity, as is often required in RF systems, the even and odd mode wave propagation velocities must be equal. It is well known in the art that strip transmission lines utilizing a single type of dielectric are a good choice for implementing directional couplers with high directivity because the even and odd mode propagation velocities are inherently equal.

A strip transmission line comprises a conductor placed between two planar ground planes. If the conductor is suspended in the air between the ground planes, then the strip transmission line is often referred to as an "air dielectric strip transmission line." An air dielectric strip transmission line is an excellent choice for low loss and good directional coupler performance. However, suspending the conductor between the planar ground planes is often difficult to realize using conventional printed circuit board (PCB) manufacturing techniques.

An air dielectric strip transmission line known in the prior art is disclosed in U.S. Pat. No. 5,712,607 to Dittmer et al. This structure provides low loss, but does not readily allow for a high performance (loose) directional coupler design. In particular, the odd mode propagation velocity will lag the even mode due to the dielectric material between edge coupled transmission lines. As disclosed in U.S. Pat. No. 4,394,630 to Kenyon et al., adding capacitance to the even mode may help to equalize the propagation velocities and hence improve the directivity of the coupler. While the method of compensation described by Kenyon et al. does improve directivity performance of a directional coupler, it is difficult to achieve the desired level of performance. Further, design time is extended due to the often difficult task of compensating coupling structures.

Accordingly a need exists for an improved air dielectric strip transmission line structure which overcomes the above noted problems.

SUMMARY OF THE INVENTION

In a first aspect the present invention provides a directional coupler comprising a conductive housing having an inner open space and a laminated structure including planar dielectric and conductive layers forming air dielectric coupled striplines within the open space. The laminated structure is a printed circuit board (PCB) formed of the dielectric and conductive layers. The air dielectric coupled striplines are formed by voids in sections of the PCB which electrically disconnect portions of the conductive layers.

In a preferred embodiment of the directional coupler the conductive housing comprises a top conductive cover and a bottom conductive cover having recesses and mating edge portions and defining the inner open space. The laminated structure is positioned between the top conductive cover and the bottom conductive cover and the air dielectric coupled striplines are configured within the inner open space. The air dielectric coupled striplines may for example comprise a through air dielectric stripline spaced from a coupling air dielectric stripline and the voids in sections of the PCB electrically disconnect the through air dielectric stripline and the coupling air dielectric stripline. The laminated structure may include a first laminar substructure comprising a first conductive layer and a second conductive layer separated by a first dielectric layer therebetween. The laminated structure may further include a second laminar substructure comprising a third conductive layer and a fourth conductive layer separated by a second dielectric layer therebetween. The first laminar substructure and the second laminar substructure may be separated by a prepeg. The first conductive layer provides transfer of ground to the top conductive cover in a first edge portion of the PCB and an electrically disconnected region thereof comprises the top surface of the air dielectric striplines in a second portion of the PCB within the open space of the housing. The fourth conductive layer provides transfer of ground to the bottom conductive cover in the first portion of the PCB and an electrically disconnected region thereof comprises the bottom surface of the air dielectric striplines in the second portion of the PCB. The side surfaces of the air dielectric coupled striplines are preferably plated with conductive material to equalize the potential of the first and fourth conductive layers. The directional coupler preferably further comprises plural microstrip transmission lines coupled to the air dielectric striplines. The directional coupler further may also comprise conductive vias coupling the microstrip transmission lines to the air dielectric coupled striplines, wherein the vias equalize the potential at transitions between the microstrip transmission lines and the air dielectric coupled striplines. At least a portion of the top conductive cover is spaced at a planar depth from at least a portion of the top surface of the air dielectric coupled striplines to provide a top ground reference for the air dielectric striplines and at least a first portion of the bottom conductive cover is spaced at a planar depth from at least a portion of the bottom surface of the air dielectric coupled striplines to provide a bottom ground reference for the air dielectric striplines. At least a second portion of the bottom conductive cover is spaced at a planar depth from at least a portion of the bottom surface of the microstrip transmission line to provide room for the microstrip transmission line. The microstrip transmission lines preferably comprise portions of the fourth conductive layer.

According to another aspect the present invention provides a method for constructing a directional coupler. The method comprises providing a printed circuit board (PCB) comprising a laminated structure including planar dielectric and conductive layers and forming air dielectric coupled striplines by removing sections of the PCB. The method further comprises surrounding the air dielectric striplines with a conductive housing to define an air dielectric cavity around the striplines.

In a preferred embodiment of the method for constructing a directional coupler, the conductive housing comprises a top conductive cover and a bottom conductive cover and surrounding the air dielectric striplines comprises mounting the PCB between edge portions of the top and bottom covers with the air dielectric striplines configured in a central air dielectric cavity between the top and bottom conductive covers. The laminated structure comprising the PCB preferably includes a first laminar substructure comprising a first conductive layer and a second conductive layer separated by a first dielectric layer therebetween and the method further comprises removing a portion of the first conductive layer around the edge of the air dielectric cavity. The laminated structure preferably also includes a second laminar substructure comprising a third conductive layer and a fourth conductive layer separated by a second dielectric layer therebetween, and the method further comprises removing portions of the fourth conductive layer around the edge of the air dielectric cavity. The method preferably further comprises removing portions of the fourth conducive layer to define microstrip transmission lines coupled to the air dielectric striplines. The method may further comprise plating the side surfaces of the air dielectric coupled striplines to equalize the potential of the first and fourth conductive layers. The method may further comprise forming conductive vias from the microstrip transmission lines to the air dielectric coupled striplines, wherein the vias equalize the potential at transitions between the microstrip transmission lines and the air dielectric coupled striplines.

Further features and aspects of the invention are set out in the following detailed description.

DETAILED DESCRIPTION OF THE INVENTION

The present invention provides a high performance structure for RF low loss/high power routing, coupling and general mixed signal routing. To achieve low loss, an air dielectric is optimal. An air dielectric may be effectively achieved by employing a suspended substrate. However, as discussed above, a suspended substrate is a poor choice when considering the performance of loose couplers. These problems are addressed by an air dielectric strip transmission line coupling structure, implemented as a directional air dielectric stripline edge coupler, disclosed herein. This air dielectric stripline edge coupler implementation easily allows for low loss and high coupler performance while maintaining the low cost, ease of manufacture and routing flexibility of a PCB.

Figure 1:
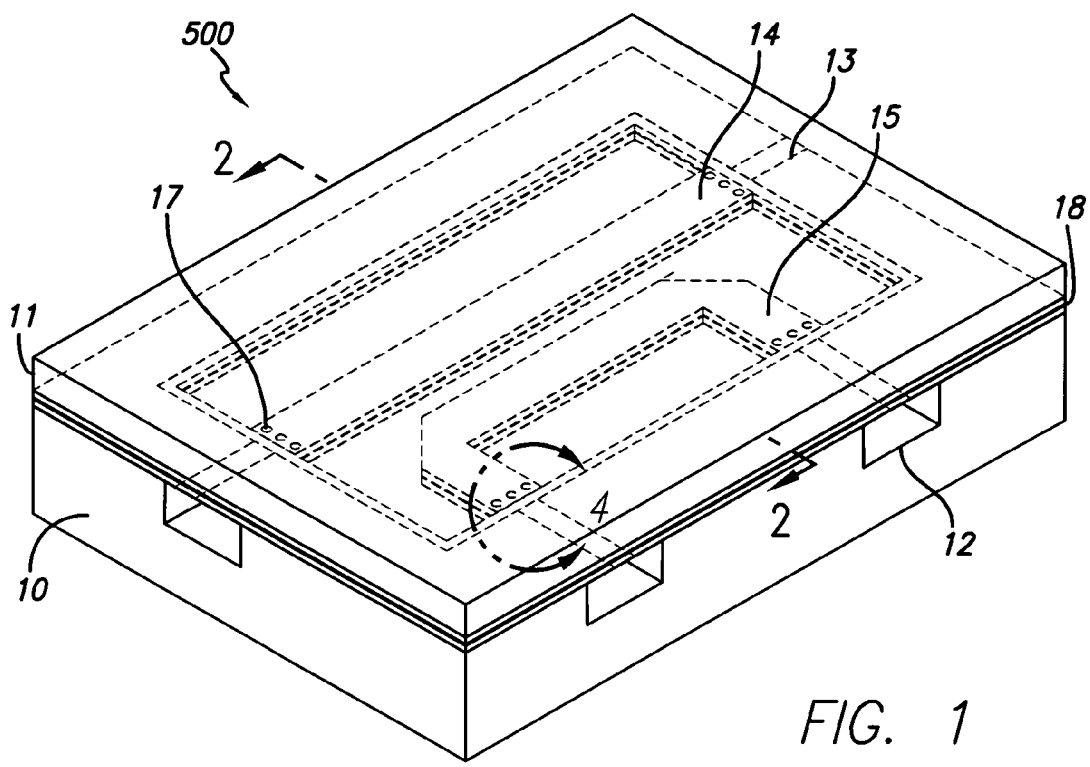
FIG. 1 shows an isometric view of an air dielectric stripline directional coupler accompanied by a microstrip to air dielectric stripline transition, according to an embodiment of the present invention.
Figure 2:
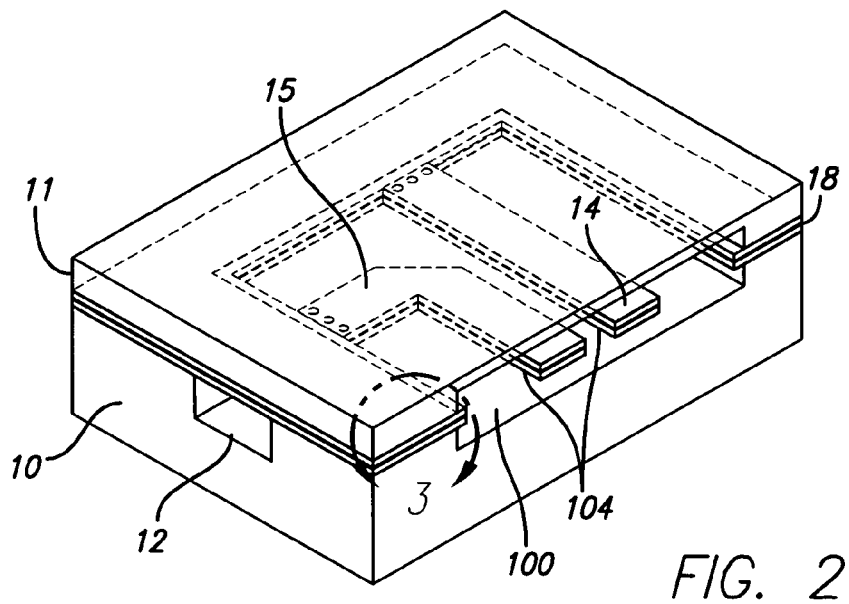
FIG. 2 shows a sectional view of the air dielectric stripline directional coupler of FIG. 1, taken along 2-2' looking in the direction of the arrows as shown in FIG. 1.
Figure 4:
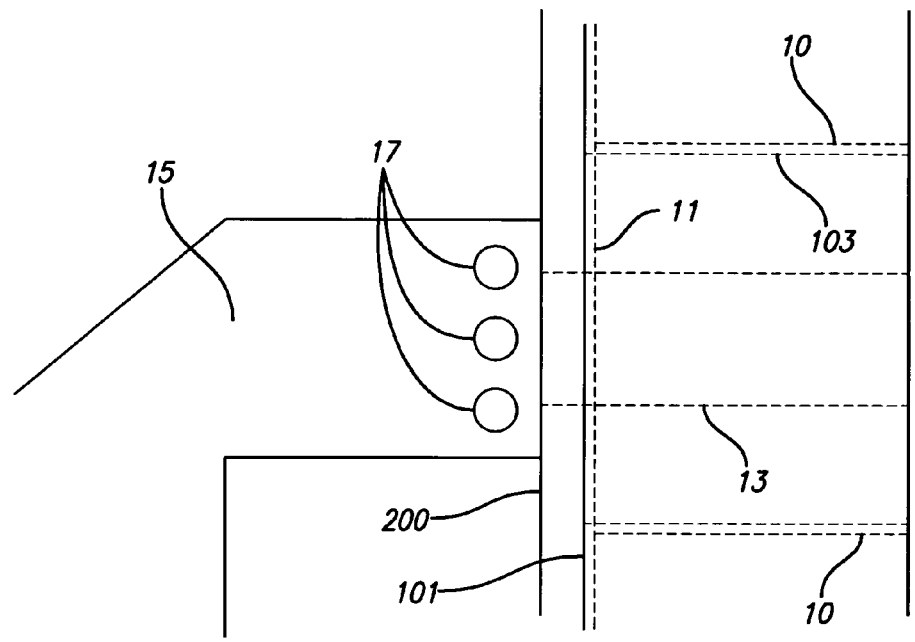
FIG. 4 shows a detail view, as indicated in FIG. 2, illustrating details on the construction of the transition from microstrip to air dielectric stripline.
Figure 3:
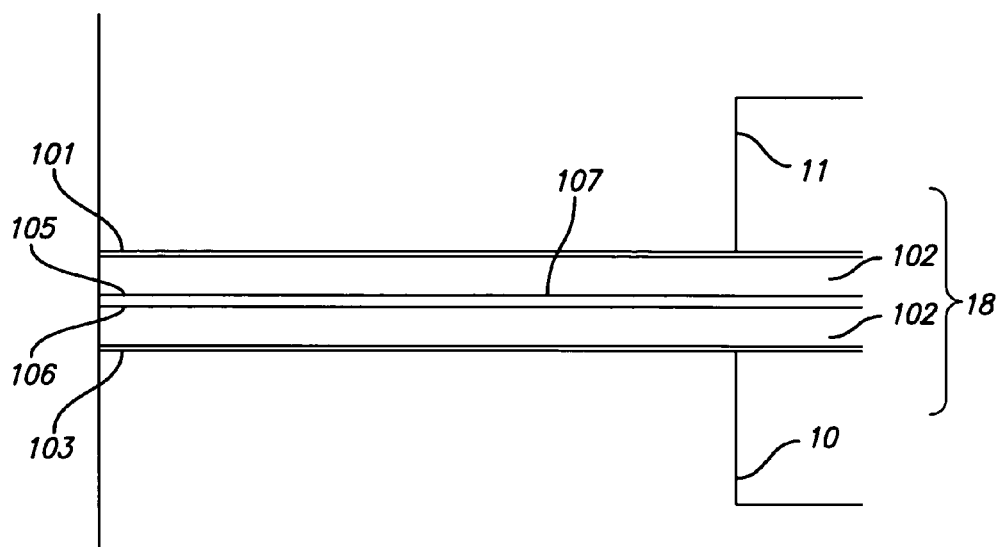
FIG. 3 shows a detail view of a portion of the sectional view of FIG. 2, illustrating more clearly a sample PCB layer stack-up that may be used for implementation of an air dielectric stripline coupling structure.
Figure 5:
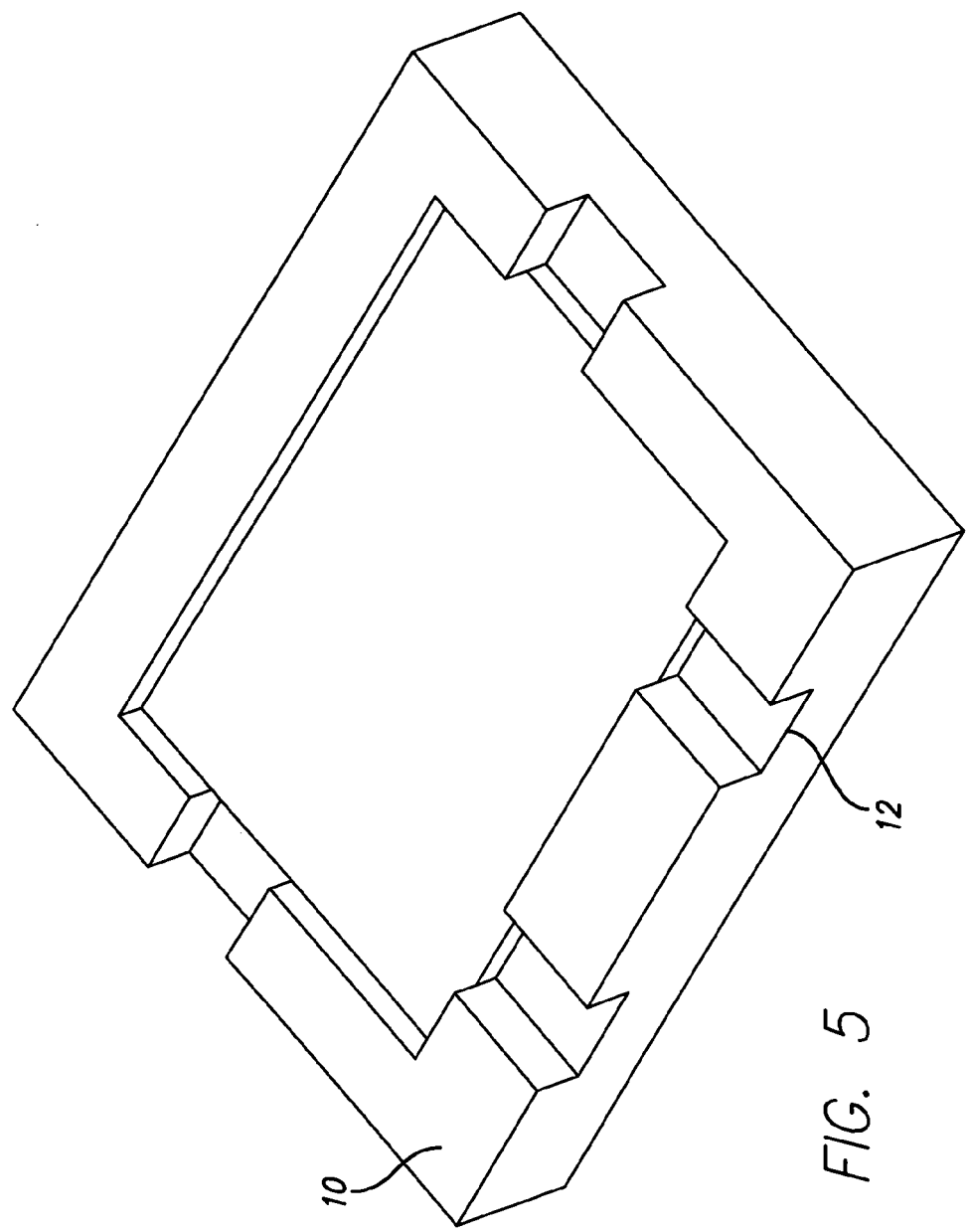
FIG. 5 shows a perspective view of the conductive bottom cover in FIG. 1.
Figure 6:
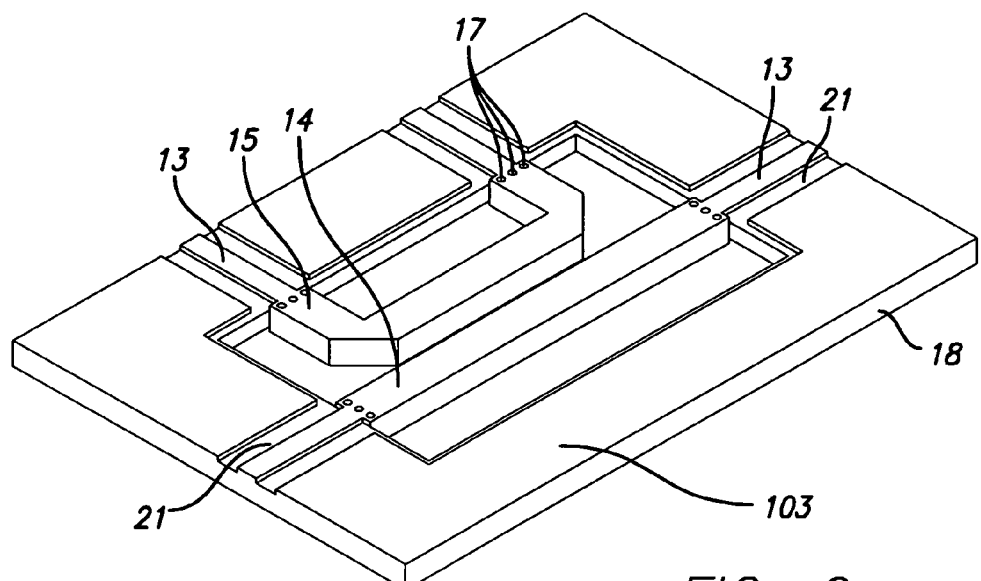
FIG. 6 shows a perspective view of the bottom surface of the air dielectric striplines in FIG. 1 formed from a PCB such as that shown in FIG. 3.

A preferred embodiment of the air dielectric stripline edge coupler 500 according to the present invention is illustrated in FIGS. 1 through 7. In this embodiment, the air dielectric stripline edge coupler 500 (FIG. 1) includes three main parts: a laminated structure comprising planar dielectric and metal layers 18 (FIGS. 1-3, 6 and 7), a conductive top cover 11 (FIGS. 1, 3 and 4) and a conductive bottom cover 10 (FIGS. 3, 4 and 5). The top and bottom covers, 11 and 10 respectively, may be constructed of metal using standard machining, casting or other manufacturing practices. The laminate structure 18 is of the type used for printed circuit boards (PCBs), and is referred to hereinafter as the PCB 18. The top and bottom covers have an inner recessed shape which when mated defines an inner opening 100 (FIG. 2) which provides an air dielectric cavity for air dielectric striplines 14, 15 (FIGS. 1, 2, 4, 6 and 7) formed from PCB 18 (FIG. 6). The PCB 18 is illustrated in FIG. 3 with four metal layers 101, 103, 105 and 106, two dielectric cores 102 and a prepreg 107. This provides flexibility for different power handling capability, however, the number and type of metal layers, cores and prepregs used is not restricted.

Figure 7:
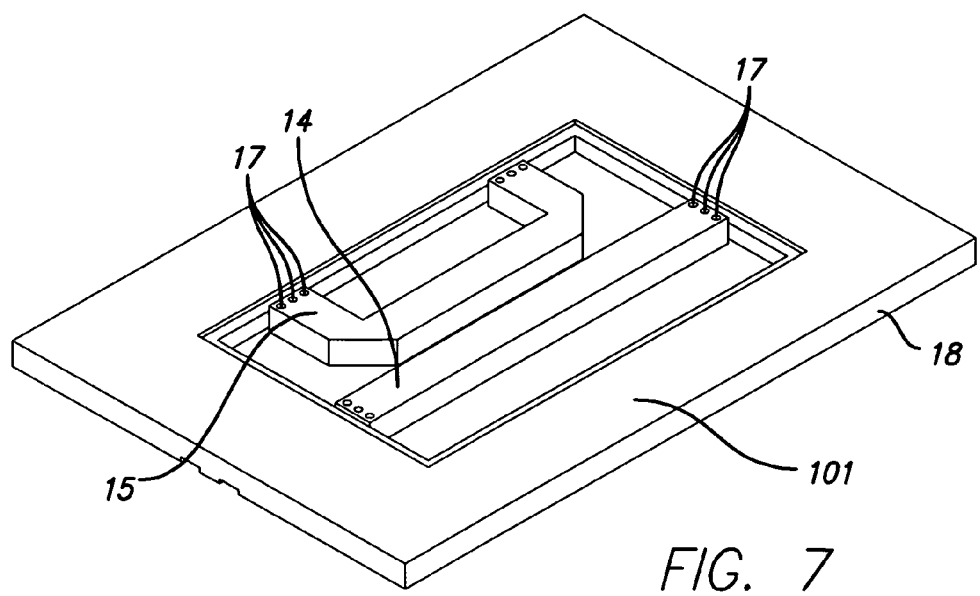
FIG. 7 shows a perspective view of the top surface of the routed PCB showing the air dielectric striplines of FIG. 1.

FIG. 6 shows a perspective view of the bottom surface of the PCB illustrating the air dielectric striplines 14 and 15 and FIG. 7 shows a perspective view of the top surface of the PCB showing air dielectric striplines 14 and 15. FIG. 6 also shows microstrip transmission lines 13 which couple the air dielectric striplines 14 and 15 to the outside RF signal sources (e.g. through conventional connectors, not shown).

As best shown in FIG. 7, the top metal layer 101 provides three functions depending on the portion of the PCB: (1) at the edge it provides transfer of ground to the top cover 11, (2) in the inner space it comprises the top surface of air dielectric coupled striplines 14 and 15, and (3) it provides ground reference for the bottom metal layer microstrip transmission line 13 (FIGS. 1, 4 and 6).

As best shown in FIG. 6, the bottom metal layer 103 provides three functions depending on the portion of the PCB: (1) at the edge portions it provides transfer of ground to the bottom cover 10 (FIGS. 3 and 4), (2) in the inner space it comprises the bottom surface of air dielectric coupled striplines 14 and 15 (FIGS. 1, 2, 4, 6 and 7), and (3) it comprises the transmission line portion of microstrip transmission line 13.

To form the air dielectric striplines 14 and 15 (FIGS. 1, 2, 4, 6 and 7), the PCB is removed in areas where the striplines are not desired. Also, the top and bottom metal layers 101 and 103 (FIGS. 3 and 4), respectively, are removed in edge regions to electrically disconnect the outer ground regions. To equalize the potential of the top and bottom metal layers of the air dielectric coupled striplines 14 and 15 (FIGS. 1, 2, 4, 6 and 7), side surfaces 104 (FIG. 2) are preferably plated.

As best shown in FIG. 6, microstrip transmission lines 13 at the ends of the through air dielectric stripline 14, are formed by removing portions 21 (FIG. 6) of the bottom layer 103 of the PCB 18. Microstrip transmission lines 13 at ends of the coupling stripline 15 are formed in a similar fashion as the microstrip transmission lines for the through stripline 14. To facilitate a well-behaved transition from bottom layer microstrip transmission lines 13 to air dielectric coupled striplines 14 and 15, in the transition from bottom layer microstrip 13 to dielectric coupled stripline14 and bottom layer microstrip 13 to dielectric coupled stripline 15, vias 17 (FIGS. 4, 6, 7) are provided. A transition region is detailed in FIG. 4. The vias 17 equalize the potential of the top 101 and bottom 103 metal layers that make up the air dielectric coupled striplines 14 and 15. The portion of the top and bottom metal layers 101 and 103, respectively, providing ground discontinue at an appropriate distance from the transition plane 200 (FIG. 4). The top and bottom covers, 11 and 10 respectively, also end at an appropriate distance from the transition plane 200, defining the beginning of an air dielectric cavity 100 (FIG. 2).

The conductive top cover 11 and conductive bottom cover 10 provide the ground reference for the air dielectric stripline edge coupler 500. The top cover 11 contacts the edge portion of top metal layer 101 of the PCB 18, which provides ground transfer between the PCB 18 and the top cover 11. Similarly, the bottom cover 10 contacts the bottom metal layer 103 of the PCB 18 to provide ground transfer between the PCB 18 and the bottom cover 10. The top cover 11 defines the cavity 100 (FIG. 2) at the correct planar depth relative to the top surface of the PCB 18 so as to provide the air stripline top ground. The bottom cover 10 defines two cavities—bottom spacing of cavity 100 and cavity 12 (FIGS. 1, 2 and 5). Cavity 100 is placed at a planar depth relative to the bottom of the PCB 18 so as to provide the air stripline bottom ground. Cavity 12 (FIGS. 1, 2 and 5) is placed at a planar distance from the bottom layer 103 of the PCB 18 so as not to interfere with a microstrip transmission line 13.

Construction of the air dielectric stripline coupling structure PCB 18 may be accomplished in the following manner. First, the PCB 18 is constructed using industry standard techniques. The undesired portions of layers 101 and 103 are then removed using etching or mechanical means or other known techniques. The PCB 18 is then routed to remove the unwanted PCB material to create the voids around the air dielectric strip transmission lines 14 and 15. When routing is complete, the PCB is plated to create the through hole vias 17 and edge plating 104. The top and bottom covers, 11 and 10 respectively, are constructed separately using industry standard techniques. The three main pieces—11, 18 and 10—are then pieced together to form the air dielectric stripline edge coupled structure 500.

Although a specific embodiment of the present invention has been described above, it will be appreciated that a variety of modifications may be provided employing the teachings of the present invention and the specific embodiment is not to be viewed as limiting in nature.

What is claimed is:

1. A directional coupler comprising:
    a conductive housing having an inner open space; and
    a laminated structure including planar dielectric and conductive layers providing air dielectric coupled striplines within the open space, wherein the laminated structure is a printed circuit board (PCB) comprised of said planar dielectric and conductive layers, and wherein the air dielectric coupled striplines are provided by voids in sections of the PCB which electrically disconnect portions of the conductive layers,
    wherein the laminated structure including the planar dielectric and conductive layers providing the air dielectric coupled striplines further includes:
    a first laminar substructure comprising a first conductive layer and a second conductive layer separated by a first dielectric layer therebetween; and
    a second laminar substructure comprising a third conductive layer and a fourth conductive layer separated by a second dielectric layer therebetween,
    wherein the first laminar substructure and the second laminar substructure are separated by a prepreg.

2. The directional coupler of claim 1, wherein the conductive housing comprises a top conductive cover and a bottom conductive cover having recesses and mating edge portions and defining said inner open space and wherein said laminated structure is positioned between the top conductive cover and the bottom conductive cover and the air dielectric coupled striplines are configured within the inner open space.

3. The directional coupler of claim 2, wherein the air dielectric coupled striplines comprise a through air dielectric stripline spaced from a coupling air dielectric strip line.

4. The directional coupler of claim 3, wherein the air dielectric coupled striplines are provided by said voids in sections of the PCB to electrically disconnect the through air dielectric stripline and the coupling air dielectric strip line.

5. The directional coupler of claim 1, wherein side surfaces of the air dielectric coupled striplines are plated with conductive material to equalize the potential of the first and fourth conductive layers.

6. The directional coupler of claim 1, wherein the first conductive layer provides transfer of a ground to a top conductive cover in a first edge portion of the PCB and an electrically disconnected region thereof comprises the top surface of the air dielectric coupled striplines in a second portion of the PCB within the open space of the housing.

7. The directional coupler of claim 6, wherein the fourth conductive layer provides transfer of the ground to a bottom conductive cover in said first portion of the PCB and an electrically disconnected region thereof comprises the bottom surface of the air dielectric coupled striplines in said second portion of the PCB.

8. The directional coupler of claim 1, further comprising plural microstrip transmission lines coupled to the air dielectric coupled striplines.

9. The directional coupler of claim 8, wherein at least a portion of a top conductive cover is spaced at a planar depth from at least a portion of the top surface of the air dielectric coupled striplines to provide a top ground reference for the air dielectric coupled striplines.

10. The directional coupler of claim 9, wherein at least a first portion of a bottom conductive cover is spaced at a planar depth from at least a portion of the bottom surface of the air dielectric coupled striplines to provide a bottom ground reference for the air dielectric coupled striplines.

11. The directional coupler of claim 10, wherein at least a second portion of the bottom conductive cover is spaced at a planar depth from at least a portion of the bottom surface of the plural microstrip transmission lines.

12. The directional coupler of claim 11, wherein said plural microstrip transmission lines comprise portions of said fourth conductive layer.

13. The directional coupler of claim 8, further comprising conductive vias coupling the microstrip transmission lines to the air dielectric coupled striplines, wherein the vias equalize the potential at transitions between the microstrip transmission lines and the air dielectric coupled striplines.

14. A method for constructing a directional coupler, comprising:
    providing a printed circuit board (PCB) comprising a laminated structure including planar dielectric and conductive layers;
    forming air dielectric coupled striplines by removing sections of the PCB; and
    surrounding the air dielectric coupled striplines with a conductive housing to define an air dielectric cavity around the air dielectric coupled striplines, wherein the laminated structure comprising the planar dielectric and conductive layers forming the air dielectric coupled striplines includes a first laminar substructure comprising a first conductive layer and a second conductive layer separated by a first dielectric layer therebetween and wherein said method further comprises removing a portion of the first conductive layer around the edge of said air dielectric cavity, wherein the laminated structure comprising the planar dielectric and conductive layers forming the air dielectric coupled striplines includes a second laminar substructure comprising a third conductive layer and a fourth conductive layer separated by a second dielectric layer therebetween, and wherein said method further comprises removing portions of the fourth conductive layer around the edge of the air dielectric cavity, wherein the method further comprises removing portions of the fourth conductive layer to define microstrip transmission lines coupled to said air dielectric coupled striplines, and wherein the method further comprises plating the side surfaces of the air dielectric coupled striplines to equalize the potential of the first and fourth conductive layers.

15. The method of claim 14, wherein the conductive housing comprises a top conductive cover and a bottom conductive cover, and wherein surrounding the air dielectric coupled striplines comprises mounting the PCB between edge portions of the top and bottom covers with the air dielectric coupled striplines configured in a central air dielectric cavity between the top and bottom conductive covers.

16. The method of claim 14, further comprising forming conductive vias from the microstrip transmission lines to the air dielectric coupled striplines, wherein the vias equalize the potential at transitions between the microstrip transmission lines and the air dielectric coupled striplines.

* * * * *